United States Patent
Yanaka

(10) Patent No.: US 6,890,701 B2
(45) Date of Patent: May 10, 2005

(54) PHOTOPOLYMERIZABLE COMPOSITION

(75) Inventor: Hiromitsu Yanaka, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 135 days.

(21) Appl. No.: 10/237,707

(22) Filed: Sep. 10, 2002

(65) Prior Publication Data

US 2003/0129524 A1 Jul. 10, 2003

(30) Foreign Application Priority Data

Sep. 11, 2001 (JP) .................................. 2001-275072

(51) Int. Cl.$^7$ ............................................. G03F 7/032
(52) U.S. Cl. ............................... 430/281.1; 430/280.1; 430/288.1
(58) Field of Search .......................... 430/281.1, 280.1, 430/288.1

(56) References Cited

U.S. PATENT DOCUMENTS

| | | | |
|---|---|---|---|
| 5,053,316 A | * 10/1991 | Suzuki et al. | ............ 430/281.1 |
| 5,080,999 A | 1/1992 | Imai et al. | |
| 5,250,385 A | 10/1993 | Kondo et al. | |
| 5,571,642 A | 11/1996 | Wakata et al. | |

FOREIGN PATENT DOCUMENTS

| | | |
|---|---|---|
| EP | 0 360 151 A2 | 3/1990 |
| EP | 0 726 498 A1 | 8/1996 |
| EP | 1 091 247 A2 | 4/2001 |
| EP | 1 096 315 A1 | 5/2001 |
| GB | 1 463 900 | 2/1977 |
| JP | 2000-187322 A | 7/2000 |
| WO | WO 00/48836 | 8/2000 |

OTHER PUBLICATIONS

Patent Abstracts of Japan—56 052744 (1981), vol. 005, No. 110.
Patent Abstracts of Japan—56 022312 (1981), vol. 005, No. 071.
Patent Abstracts of Japan—08 184961 (1996), vol. 1996, No. 11.
XP–002251388—JP 08 184960 (1996).
European Search Report dated Aug. 29, 2003.

* cited by examiner

*Primary Examiner*—John S. Chu
(74) *Attorney, Agent, or Firm*—Sughrue Mion, PLLC

(57) ABSTRACT

A photopolymerizable composition which comprises (A) a polymerizable compound having at least one radical-polymerizable ethylenically unsaturated double bond per molecule and a cohesive energy density of not smaller than 500 J/cm$^3$, (B) a radical polymerization initiator and (C) a binder polymer and cures when exposed to light.

6 Claims, No Drawings

PHOTOPOLYMERIZABLE COMPOSITION

FIELD OF THE INVENTION

The present invention relates to a photopolymerizable composition capable of curing upon exposure to ultraviolet rays, visible light, infrared rays or the like. More particularly, the present invention relates to a photopolymerizable composition which can be used as a photosensitive layer for negative-working lithographic printing plate precursor.

BACKGROUND OF THE INVENTION

Various systems for making plate directly from digital data from computer have heretofore been developed. For example, a photopolymerization system image-forming material adapted for exposure to blue or green visible light from laser has been noted as a photosensitive layer for lithographic printing plate which can attain a high press life by the toughness of coat layer cured by photopolymerization in that it is sensitive to argon laser beam and a direct plate-making of high sensitivity utilizing a photopolymerization initiation system is made possible.

By way of examples, as a laser printing plate utilizing a photopolymerization initiation system sensitive to visible laser beam such as argon laser beam there has been used one comprising a photopolymerizable composition layer comprising a compound having an addition-polymerizable ethylenically double bond, a photopolymerization initiator and optionally an organic high molecular binder and a heat polymerization inhibitor provided on an aluminum sheet as a support, and a barrier layer to oxygen that inhibits polymerization provided thereon. Such a photopolymerizable lithographic printing plate is exposed to a desired image so that the exposed area undergoes curing by polymerization, and then subjected to removal of the unexposed area with an alkali aqueous solution (development) to form an image thereon.

In recent years, laser has been remarkably developed. In particular, high output and small-sized solid lasers and semiconductor lasers emitting infrared rays having a wavelength of from 760 nm to 1,200 nm have been easily available. These lasers are very useful as a recording light source for use in direct plate making from digital data from computer, etc. To this end, a material capable of recording from these infrared laser beams has been desired in addition to the aforementioned practically useful photosensitive recording materials sensitive to visible light range of not higher than 760 nm. For example, a negative-working image-recording material having a photosensitive layer comprising a photopolymerizable composition containing an infrared absorber, a photo or heat polymerization initiator and a compound having a polymerizable or crosslinkable functional group is known as described in Japanese Patent Laid-Open No. 2000-187322.

A photopolymerizable composition, regardless of being cured by visible light or infrared rays, essentially comprises a polymerization initiator such as radical generator, a monomer having a polymerizable functional group and a binder polymer for enhancing the film properties of photosensitive layer. When the photopolymerizable composition is exposed to light or heated, the initiator in the exposed (heated) area generates a radical which causes the polymerizable compound to undergo polymerization/crosslinking reaction causing the curing reaction of the photosensitive layer resulting in the formation of image area. Such a photopolymerizable composition contains a large amount of a polymerizable compound which is mostly a compound having a relatively low molecular weight such as monomer and oligomer.

Lithographic printing plate precursors are normally packaged under light shielding and then transported or stored in various environments.

A negative-working photosensitive layer comprising a photopolymerizable composition which cures upon exposure to light is disadvantageous in that when stored at high temperature over an extended period of time, polymerization of polymerizable compound occurs in the dark to insolubilize unexposed area, resulting in image defect such as poor development. Particularly, in an image-forming material which is exposed to infrared laser and then directly developed without heat treatment, it is difficult to fulfill both sensitivity and preservation stability.

SUMMARY OF THE INVENTION

It is therefore an aim of the invention is to resolve the problems in prior art. Specifically, an object of the invention is to provide a photopolymerizable composition which cures at a high sensitivity when exposed to visible light or infrared laser beam, is useful as a photosensitive layer for negative-working lithographic printing plate precursor capable of recording digital data directly from computer or the like, has an excellent preservation stability, can form high quality image, and is capable of preparing a printing plate excellent in printing durability and resistance to chemicals.

Other objects of the invention will become apparent from the following detailed description and examples.

The inventors noted polymerizable compounds contained in a large amount in photopolymerizable compositions and made extensive studies of these compounds. As a result, it was found that the aforementioned objects of the invention could be accomplished by the use of a polymerizable compound having specific structural physical properties to complete the invention.

The present invention includes the following items:
(1) A photopolymerizable composition which comprises (A) a polymerizable compound having at least one radical-polymerizable ethylenically unsaturated double bond per molecule and a cohesive energy density of not smaller than 500 J/cm$^3$, (B) a radical polymerization initiator and (C) a binder polymer and cures when exposed to light.
(2) The photopolymerizable composition according to item (1) which further comprises (D) a compound that generates heat when exposed to infrared rays in addition to the components (A), (B) and (C) and cures when exposed to infrared laser beam.

DETAILED DESCRIPTION OF THE INVENTION

In the invention, as the polymerizable compound having a radical-polymerizable ethylenically unsaturated double bond there is used a molecule having a cohesive energy density of not smaller than 500 J/cm$^3$.

Molecules having a high cohesive energy density have a strong mutual interaction therebetween and thus are considered to exist in a form of aggregate having a certain size in the photosensitive layer of lithographic printing precursor. This inhibits the movement of the molecules. Therefore, even if there is a slight amount of active species produced during storage, the polymerization of the polymerizable compound is inhibited, providing the polymerizable compound with an excellent preservation stability. On the other hand, when the polymerizable compound is exposed, for example, to infrared rays, the exposed area shows a temperature rise that suddenly lowers the cohesive energy of the molecules to weaken the intermolecular action.

This enhances the movement of the molecules, making it possible to contribute to polymerization and hence form an image having an excellent quality.

As described above, the photopolymerizable composition of the invention cures at high sensitivity when exposed to visible light or infrared laser beam and can be used as a photosensitive layer for negative-working lithographic printing plate precursor which can directly record digital date from computer or the like. Even when stored at a high temperature for a long period of time, the photopolymerizable composition of the invention can difficultly undergo polymerization in the dark and thus it is excellent in preservation stability and can form an image having a high quality. Further, the photopolymerizable composition of the invention can provide a printing plate having excellent printing durability and resistance to chemicals.

The term "cohesive energy density" as used herein means a value calculated by the method proposed by Fendors. For details of Fendors' method for calculating cohesive energy density, reference can be made to R. F. Fendors, "Polym. Engi. Sci.", 14, 147 (1974) and D. W. Krevelen, "Properties of Polymers", 3rd edition, Elsevier, 1997, pp. 189–200.

In accordance with the aforementioned method, the cohesive energy of molecule is calculated as the sum of cohesive energy density of constituent atoms or atomic groups.

Cohesive energy: $Ecoh$ (J/mol)=$\Sigma(ni \times Ei)$ where ni is the number of mols of atoms or atomic groups constituting 1 mol of monomer; and Ei is the cohesive energy contribution constant (J/mol).

The cohesive energy density is calculated by dividing the cohesive energy by the sum of volume of the atoms or atomic groups constituting 1 mol of monomer.

In other words, the cohesive energy density is given by the equation $\Sigma(ni \times Ei)/\Sigma(ni \times Vi)$ wherein Vi is the volume ($cm^3$/mol) of the atoms or atomic groups constituting 1 mol of monomer.

The cohesive energy contribution constant and volume of the atoms or atomic groups are exemplified in the table below.

TABLE 1

| Atom or Atomic Group | Ecoh (J/mol) | V ($cm^3$/mol) |
|---|---|---|
| —$CH_2$— | 4,940 | 16.1 |
| —$CH_3$ | 4,710 | 33.5 |
| —CH< | 3,430 | −1 |
| >C< | 1,470 | −19.2 |
| $CH_2$= | 4,310 | 28.5 |
| —CH= | 4,310 | 13.5 |
| >C= | 4,310 | −5.5 |
| Phenyl | 31,940 | 71.4 |
| Phenylene (o-, m-, p-substituted) | 31,940 | 52.4 |
| Closed ring (5 or more atoms) | 1,050 | 16 |
| —Cl | 11,550 | 24 |
| —Br | 15,490 | 30 |
| —O— | 3,350 | 3.8 |
| —OH | 29,800 | 10 |
| —COOH | 27,630 | 28.5 |
| —$CO_2$— | 18,000 | 18 |
| —$CONH_2$ | 41,860 | 17.5 |

TABLE 1-continued

| Atom or Atomic Group | Ecoh (J/mol) | V ($cm^3$/mol) |
|---|---|---|
| —CONH— | 33,490 | 9.5 |
| —CON< | 29,510 | −7.7 |
| —NHCOO— | 26,370 | 18.5 |

The cohesive energy density of a monomer having the structure shown below is calculated as follows:

TABLE 2

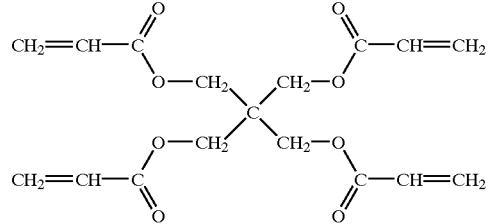

| Atomic Groups Constituting Molecule | ni | Ei | Vi | ΣEi | Σvi |
|---|---|---|---|---|---|
| —$CH_2$— | 4 | 4,940 | 16.1 | 19,760 | 64.4 |
| —$CO_2$— | 4 | 18,000 | 18 | 72,000 | 72 |
| —CH= | 4 | 4,310 | 13.5 | 17,240 | 54 |
| =$CH_2$ | 4 | 4,310 | 28.5 | 17,240 | 114 |
| >C< | 1 | 1,470 | −19.2 | 1,470 | −19.2 |

Ecoh 127,710
V 285.2
Ecoh/V = 448 J/$cm^3$

Thus, the cohesive energy density of the molecule is calculated to be 448 J/$cm^3$.

DETAILED DESCRIPTION OF THE INVENTION

The photopolymerizable composition of the invention will be described in detail hereinafter.

The photopolymerizable composition of the invention comprises an initiator, a photosensitizer which is optionally added, and a compound having a cohesive energy density of not smaller than 500 J/$cm^3$ as a polymerizable compound. The components constituting the photopolymerizable composition of the invention will be successively described hereinafter.

(A) Polymerizable compound having at least one radical-polymerizable ethylenically unsaturated double bond per molecule and a cohesive energy density of not smaller than 500 J/$cm^3$ (hereinafter sometimes referred to as "polymerizable compound")

The polymerizable compound, which can be preferably used in the invention, has a cohesive energy density of not smaller than 500 J/$cm^3$, more preferably not smaller than 700 J/$cm^3$. The upper limit of cohesive energy density of the polymerizable compound is suitably about 3,500. The radical-polymerizable compound may be selected from known radical-polymerizable compounds at least one ethylenically unsaturated double bond per molecule. These compounds have a chemical form such as a monomer, a prepolymer, an oligomer or a mixture thereof or a copolymer thereof. Examples of the monomer include unsaturated carboxylic acid (e.g., acrylic acid, methacrylic acid, itaconic acid, crotonic acid, isocrotonic acid, maleic acid), and ester and amide thereof. Preferably, ester of unsaturated carboxylic acid with aliphatic polyhydric alcohol compound and amide of unsaturated carboxylic acid with aliphatic polyvalent amine compound are used. Further, products of addition reaction of unsaturated carboxylic acid or amide having a nucleophilic substituent such as hydroxyl group, amino group or mercapto group with monofunctional or polyfunctional isocyanate or epoxy, or products of dehydration condensation reaction of unsaturated carboxylic acid or amide having a nucleophilic substituent such as hydroxyl group, amino group and mercapto group with monofunctional or polyfunctional carboxylic acid are preferably used. Moreover, products of addition reaction of unsaturated carboxylic acid ester or amide having an electrophilic substituent such as isocyanate group and epoxy group with monofunctional or polyfunctional alcohol, amine or thiol are preferably used. Further, products of substitution reaction of unsaturated carboxylic acid ester or amide having a releasable substituent such as halogen group and tosyloxy group with monofunctional or polyfunctional alcohol, amine or thiol are preferably used. Further examples thereof employable include those obtained by the same reactions as mentioned above except that the unsaturated carboxyl acid is replaced by unsaturated phosphonic acid, styrene or the like.

Specific examples thereof employable will be shown below, but the invention is not limited thereto.

Acrylates and methacrylates such as tris(acryloyloxyethyl) isocyanurate (cohesive energy density: 739 $J/cm^3$), tris(methacryloyloxyethyl)isocyanurate (714 $J/cm^3$), bis (acryoyloxyethyl)hydroxyethyl isocyanurate (921 $J/cm^3$), tris (hydroxyethyl)isocyanurate dimethacrylate (906 $J/cm^3$), 1,3,5-tris (2-acryloylethylaminocarbonyl)benzene (677 $J/cm^3$), 1,3,5-tris(2-methacryloylethylaminocarbonyl)benzene (639 $J/cm^3$), 1,2-benzenedicarboxylic acid bis[2-hydroxy-3[(1-oxo-2-propenyl)oxy]propyl]ester (713 $J/cm^3$), N,N'-methacryloylhexamethylenediamine (539 $J/cm^3$), N,N'-acryloylhexamethylenediamine (570 $J/cm^3$) and p-bis(acryloylamino)benzene (747 $J/cm^3$).

Styrenes such as N,N'-bis (styrylcarbonyl)hexamethylene diamine (584 $J/cm^3$), N,N'-bis (styrylcarbonyl) 1,4-cyclohexylenediamine (647 $J/cm^3$), 1,3,5-tris(2-styrylcarbonylaminoethoxycarbonyl)benzene (681 $J/cm^3$) and 1,3,5-tris(2-styrylcarboxylethylaminocarbonyl)benzene (708 $J/cm^3$).

These compounds may be in a chemical form such as a monomer, a prepolymer, i.e., a dimmer or a trimer, an oligomer or a mixture thereof or a copolymer thereof so far as they have a cohesive energy density of not smaller than 500 $J/cm^3$, preferably not smaller than 700 $J/cm^3$.

Polymerizable compounds having a cohesive energy density of less than 500 $J/cm^3$ exhibit a lowered mutual interaction when stored at a high temperature during transportation. Thus, the individual molecules have activated movement and can be easily attacked by radical initiation species which have been produced in a small amount. Accordingly, when stored at a high temperature, these polymerizable compounds are subject to polymerization in the dark that causes poor development in the non-image area during image formation.

Further, a lithographic printing plate precursor wherein the formation of image is conducted by irradiation of an infrared laser usually has a problem in that the infrared laser beam for exposure does not reach to the bottom of image-forming layer due to the absorption thereof by infrared absorbents or the heat generated tends to diffuse to a substrate having high heat conductivity so that hardening of the image is insufficient. As a result, the printing plate formed is poor in film strength against a stress received during printing and resistance to chemicals, for example, printing ink, dampening water or a plate cleaner. However, when the polymerizable compound according to the invention is used, the excellent image-forming property is obtained and the decrease in film strength is prevented. Also, the resulting printing plate exhibits the excellent printing durability and resistance to chemicals at printing.

The polymerizable compounds of the invention may be used singly or in combination of two or more thereof.

The polymerizable compounds of the invention are incorporated in the photopolymerizable composition of the invention preferably in an amount of from 5 to 80% by weight, more preferably in an amount of from 10 to 60% by weight as calculated in terms of solid content.

(B) Radical Polymerization Initiator

The radical polymerization initiator which can be preferably used in the invention can be selected from compounds which generate radicals when received energy, for example, light, heat, radiation or the like. Various photo-initiators and combinations of two or more thereof (photo-initiation system) known in patents, references, etc. can be appropriately selected depending on the wavelength of light source used to initiate polymerization.

In the case where an ultraviolet ray having a wavelength of not greater than 400 nm is used as a light source, benzyl, benzoin ether, Michler's ketone, anthraquinone, acridine, phenazine, benzophenone, etc. can be widely used.

Various photo-initiation systems have been proposed for the case where visible light, argon laser beam or YAG-SHG laser beam having a wavelength of not lower than 400 nm is used as a light source. Examples of these photo-initiation systems include certain kinds of photosensitive dyes disclosed in U.S. Pat. No. 2,850,445, composite initiation system comprising dye and amine (Japanese Patent Publication No. 1969-20189), system comprising hexaryl biimidazole, radical-generator and dye in combination (Japanese Patent Publication No. 1970-37377), system comprising hexaryl biimidazole and p-dialkylaminobenzylidene ketone in combination (Japanese Patent Publication No. 1972-2528, Japanese Patent Laid-Open No. 1979-155292), system comprising cyclic cis-α-dicarbonyl compound and dye in combination (Japanese Patent Laid-Open No. 1973-84183), system comprising substituted triazine and melocyanine dye in combination (Japanese Patent Laid-Open No. 1979-151024), system comprising 3-ketocoumarine and active agent in combination (Japanese Patent Laid-Open No. 1977-112681, Japanese Patent Laid-Open No. 1983-15503), system comprising biimidazole, styrene derivative and thiol in combination (Japanese Patent Laid-Open No. 1984-140203), system comprising organic peroxide and dye in combination (Japanese Patent Laid-Open No. 1984-140203, Japanese Patent Laid-Open No. 1984-189340), system comprising dye having rhodanine skeleton and radical generator in combination (Japanese Patent Laid-Open No. 1990-244050), system comprising titanocene and 3-ketocoumarine dye in combination (Japanese Patent Laid-Open No. 1988-221110), system comprising titanocene, xanthene dye and addition-polymerizable ethylenically unsaturated compound containing amino group or urethane group in combination (Japanese Patent Laid-Open No. 1992-221958, Japanese Patent Laid-Open No. 1992-219756), and system comprising titanocene and melocyanine dye in combination (Japanese Patent Laid-Open No. 1994-295061).

In the case where infrared rays having a wavelength of not lower than 760 nm are used for exposure, onium salts are preferably used from the standpoint of sensitivity. Specific examples of the onium salt include iodonium salt, diazonium salt, and sulfonium salt. These onium salts also act as an acid genenerator. However, these onium salts are incorporated in the composition of the invention in combination with the aforementioned radical-polymerizable compound and thus act as a radical polymerization initiator. Examples of the onium salts which can be preferably used in the invention include those represented by the following formulae (III) to (V).

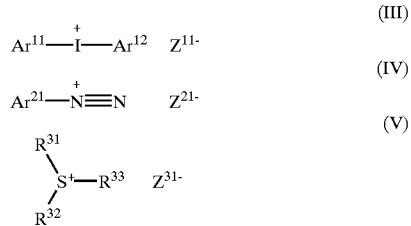

In formula (III), $Ar^{11}$ and $Ar^{12}$ each independently represent an aryl group having 20 or less carbon atoms which may have a substituent. Preferred examples of the substituent on the substituted aryl group include a halogen atom, a nitro group, an alkyl group having 12 or less carbon atoms, an alkoxy group having 12 or less carbon atoms and an aryloxy group having 12 or less carbon atoms. $Z^{11-}$ represents a counter ion selected from the group consisting of a halogen ion, a perchlorate ion, a tetrafluoroborate ion, a hexafluorophosphate ion and a sulfonate ion, preferably a perchlorate ion, a hexafluorophosphate ion or an arylsulfonate ion.

In formula (IV), $Ar^{21}$ represents an aryl group having 20 or less carbon atoms which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms and a diarylamino group having 12 or less carbon atoms. $Z^{21-}$ represents a counter ion having the same meaning as defined for $Z^{11-}$.

In formula (V), $R^{31}$, $R^{32}$ and $R^{33}$ may be the same or different and each represent a hydrocarbon group having 20 or less carbon atoms which may have a substituent. Preferred examples of the substituent include a halogen atom, a nitro group, an alkyl group having 12 or less carbon atoms, an alkoxy group having 12 or less carbon atoms and an aryl group having 12 or less carbon atoms. $Z^{31-}$ represents a counter ion having the same meaning as defined for $Z^{11-}$.

Specific examples of the onium salt which can be preferably used in the invention include those represented by formula (III) ([OI-1] to [OI-10]), those represented by formula (IV) ([ON-1] to [ON-5]), and those represented by formula (V) ([OS-1] to [OS-5]). However, the invention is not limited to these onium salts.

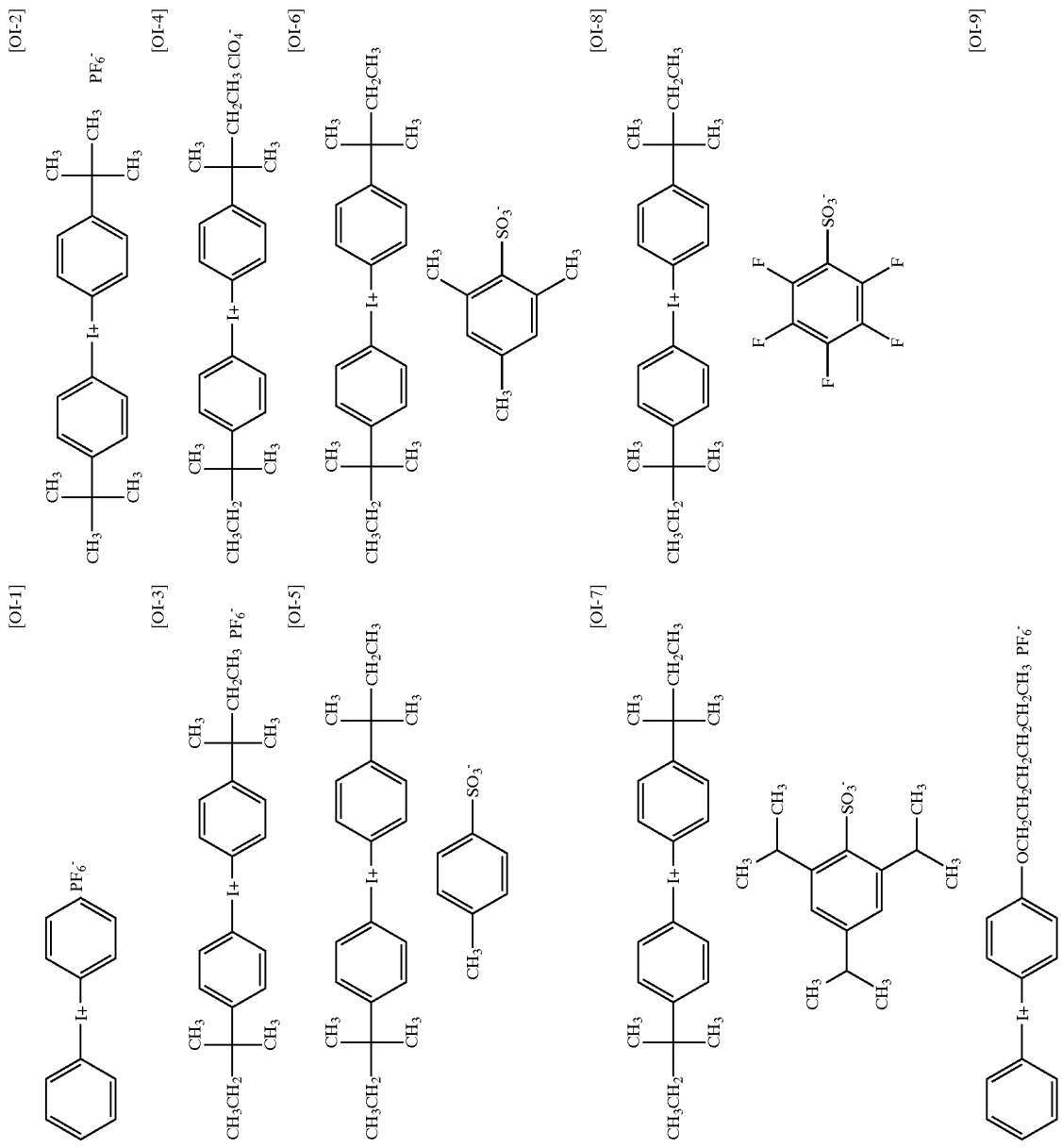

-continued
[OI-10]
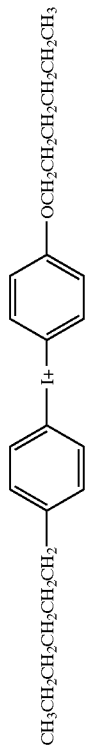
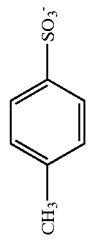
[ON-1]
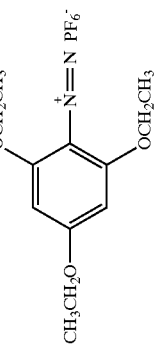
[ON-2]
[ON-3]
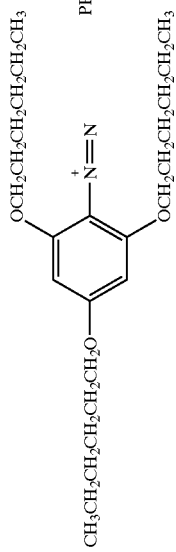
[ON-4]
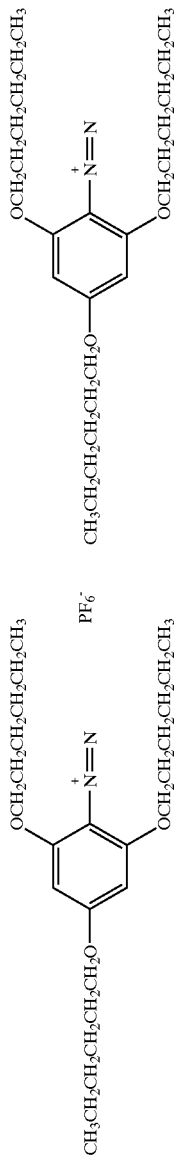
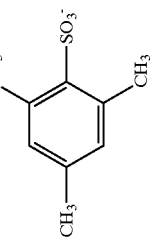

-continued
[OS-1]
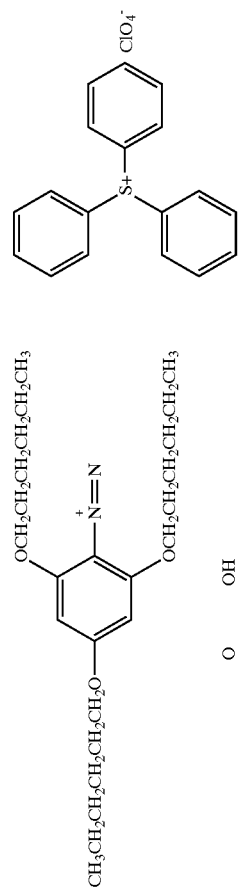
[ON-5]
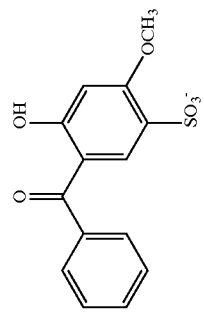
[OS-3]
[OS-2]
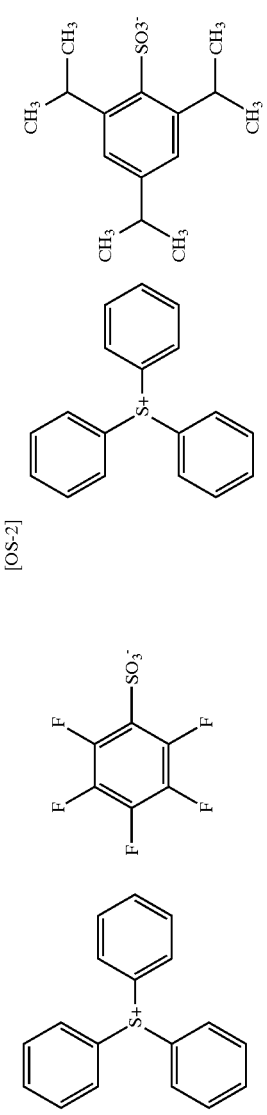

[OS-4]
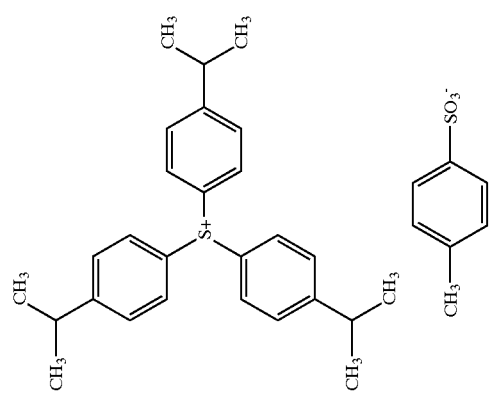
[OS-5]
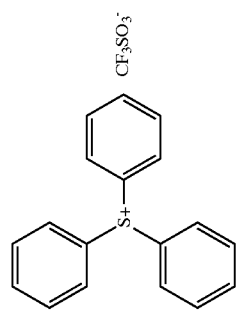

The polymerization initiator for use in the invention preferably has a maximum absorption wavelength of not higher than 400 nm, more preferably not higher than 360 nm. By predetermining the absorption wavelength within the ultraviolet range, the lithographic printing plate precursor can be handled under incandescent lamp.

The polymerization initiators may be used singly or in combination of two or more thereof.

The polymerization initiator may be incorporated in an amount of from 0.1 to 50% by weight, preferably from 0.5 to 30% by weight, and particularly preferably from 1 to 20% by weight based on the total solid content of the photopolymerizable composition. When the amount of the polymerization initiator added is less than 0.1% by weight, the resulting composition exhibits a low sensitivity. On the contrary, when the amount of the polymerization initiator added exceeds 50% by weight, the resulting composition, for example, in case of using as a photosensitive layer for lithographic printing plate, is apt to cause stain on the non-image area during printing. The polymerization initiator may be incorporated in the same layer containing other components or in a layer different from the layer containing other components.

(C) Binder Polymer

Since the photopolymerizable composition of the invention comprises a polymerizable compound in a solid form, a binder polymer is incorporated therein for retaining the solid polymerizable compound and forming a film.

As the binder there is preferably used a linear organic polymer. As the linear organic polymer there may be used any such a polymer. In the case where the photopolymerizable composition of the invention is used as a photosensitive layer in the lithographic printing plate, a linear organic polymer which is soluble or swellable in water or an aqueous alkali is preferably selected to allow development with water or an aqueous alkali. The linear organic polymer is selectively used depending on the purpose of not only using as a film-forming agent for forming a photosensitive layer but also improving developability with water, an aqueous weak alkali solution or an organic solvent. For example, when a water-soluble organic polymer is used, aqueous development is made possible. Examples of such a linear organic polymer include a radical polymer having a carboxylic group in the side chain as disclosed in Japanese Patent Laid-Open No. 1984-44615, Japanese Patent Publication No. 1979-34327, Japanese Patent Publication No. 1983-12577, Japanese Patent Publication No. 1979-25957, Japanese Patent Laid-Open No. 1979-92723, Japanese Patent Laid-Open No. 1984-53836 and Japanese Patent Publication No. 1984-71048, e.g., methacrylic acid copolymer, acrylic acid copolymer, itaconic acid copolymer, crotonic acid copolymer, maleic acid copolymer, partially-esterified maleic acid copolymer. Other examples of the linear organic polymer include an acidic cellulose derivative having a carboxylic group in the side chain. Further, a polymer obtained by adding a cyclic acid anhydride to a polymer having a hydroxy group is suitably used.

Particularly preferred among these linear organic polymers are (meth)acrylic resins having an ethylenically unsaturated double bond (e.g., an allyl group, a (meth)acryloyl group or a (meth)acrylamido group) and a carboxy group in the side chain, which have well-balanced film strength, sensitivity and developability.

Urethane-based binder polymers having an acid group as disclosed in Japanese Patent Publication No. 1995-120040, Japanese Patent Publication No. 1995-120041, Japanese Patent Publication No. 1995-120042, Japanese Patent Publication No. 1996-12424, Japanese Patent Laid-Open No. 1988-287944, Japanese Patent Laid-Open No. 1988-287947, Japanese Patent Laid-Open No. 1989-271741 and Japanese Patent Application No. 1998-116232 exhibit an excellent strength and thus they are advantageous in press life and low exposure aptitude.

Other useful water-soluble linear organic polymers include polyvinylpyrrolidone and polyethyleneoxide. In order to enhance the strength of cured film, alcohol-soluble nylon, polyether of 2,2-bis-(4-hydroxyphenyl)propane and epichlorohydrin, etc. can be used.

The polymer which can be used in the invention has a weight average molecular weight of preferably not smaller than 5,000, more preferably from 10,000 to 300,000, or a number average molecular weight of preferably not smaller than 1,000, more preferably from 2,000 to 250,000. The polymer has polydispersity (weight average molecular weight/number average molecular weight) of preferably not smaller than 1, more preferably from 1.1 to 10.

These polymers may be any of a random polymer, a block polymer and a graft polymer, preferably a random polymer.

The binder polymers of the invention may be used singly or in admixture. These polymers are incorporated in an amount of from 20 to 95% by weight, preferably from 30 to 90% by weight based on the total solid content of the photopolymerizable composition. When the amount of polymers added is less than 20% by weight, the resulting image has an insufficient strength in the image area. On the contrary, when the amount of polymer added exceeds 95% by weight, images are not formed in some cases. It is preferred that a weight ratio of the compound having a radical-polymerizable ethylenically unsaturated double bond to the linear organic polymer is from 1/9 to 7/3.

(D) Compound which Generates Heat Upon Exposure to Infrared Rays

In the case where the photopolymerizable composition of the invention is used to record with a laser emitting infrared rays, it is preferably to added a compound which generates heat upon exposure to infrared rays (hereinafter sometimes referred to as "infrared absorbent") thereto. The infrared absorbent acts to absorb infrared rays and convert it to heat. The heat thus generated causes the decomposition of the radical generator to generate radicals. The infrared absorbent for use in the invention is a dye or pigment having a maximum absorption at a wavelength of from 760 nm to 1,200 nm.

Examples of the dye employable include commercially available dyes and known dyes as disclosed in references, e.g., "Senryo Binran (Handbook of Dyes)", The Society of Synthetic Organic Chemistry, 1970. Specific examples of the dyes include azo dye, metal complex azo dye, pyrazolone azo dye, anthraquinone dye, phthalocyanine dye, carbonium dye, quinonimine dye, methine dye, cyanine dye, and metal thiolate complex. Preferred examples of the dyes include cyanine dyes as disclosed in Japanese Patent Laid-Open No. 1983-125246, Japanese Patent Laid-Open No. 1984-84356, Japanese Patent Laid-Open No. 1984-202829 and Japanese Patent Laid-Open No. 1985-78787, methine dyes as disclosed in Japanese Patent Laid-Open No. 1983-173696, Japanese Patent Laid-Open No. 1983-181690 and Japanese Patent Laid-Open No. 1983-194595, naphthoquinone dyes as disclosed in Japanese Patent Laid-Open No. 1983-112793, Japanese Patent Laid-Open No. 1983-224793, Japanese Patent Laid-Open No. 1984-48187, Japanese Patent Laid-Open No. 1984-73996, Japanese Patent Laid-Open No. 1985-52940 and Japanese Patent Laid-Open No. 1985-63744, squarilium dyes as disclosed in Japanese Patent Laid-Open No. 1983-112792, and cyanine dyes as disclosed in British Patent 434,875.

Further, near infrared-absorbing sensitizers as disclosed in U.S. Pat. No. 5,156,938 are preferably used. Other preferred examples of the dye employable include substituted arylbenzo(thio)pyrilium salts as disclosed in U.S. Pat. No. 3,881,924, trimethine thiapyrilium salts as disclosed in Japanese Patent Laid-Open No. 1982-142645 (U.S. Pat. No. 4,327,169), pyrilium-based compounds as disclosed in Japanese Patent Laid-Open No. 1983-181051, Japanese Patent Laid-Open No. 1983-220143, Japanese Patent Laid-Open No. 1984-41363, Japanese Patent Laid-Open No. 1984-84248, Japanese Patent Laid-Open No. 1984-84249, Japanese Patent Laid-Open No. 1984-146063 and Japanese Patent Laid-Open No. 1984-146061, cyanine dyes as disclosed in Japanese Patent Laid-Open No. 1984-216146, pentamethine thiopyrilium salts as disclosed in U.S. Pat. No. 4,283,475, and pyrilium compounds as disclosed in Japanese Patent Publication No. 1993-13514 and Japanese Patent Publication No. 1993-19702. Other preferred examples of the dye employable include near infrared-absorbing dyes of formulae (I) and (II) disclosed in U.S. Pat. No. 4,756,993. Particularly preferred among these dyes are cyanine dye, squarilium dye, pyrilium dye, and nickel thiolate complex.

More desirable among these dyes is cyanine dye, particularly one represented by the following formula (I):

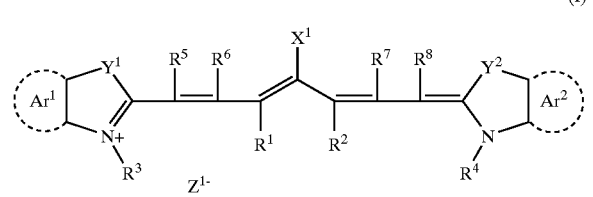

(I)

In formula (I), $X^1$ represents a halogen atom, $X^2$-$L^1$ or $NL^2L^3$ in which $X^2$ represents an oxygen atom or sulfur atom, $L^1$ represents a $C_1$–$C_{12}$ hydrocarbon group and $L^2$ and $L^3$ each independently represent a $C_1$–$C_{12}$ hydrocarbon group. $R^1$ and $R^2$ each independently represent a $C_1$–$C_{12}$ hydrocarbon group. From the standpoint of storage stability of a coating solution for the photosensitive layer, $R^1$ and $R^2$ each are preferably a hydrocarbon group having 2 or more carbon atoms. It is particularly preferred that $R^1$ and $R^2$ are connected to each other to form a 5-membered or 6-membered ring.

$Ar^1$ and $Ar^2$ may be the same or different and each represent an aromatic hydrocarbon group which may have a substituent. $Y^1$ and $Y^2$ maybe the same or different and each represent a sulfur atom or a dialkylmethylene group having 12 or less carbon atoms. $R^3$ and $R^4$ may be the same or different and each represent a hydrocarbon group having 20 or less carbon atoms which may have a substituent. Preferred examples of the substituent include an alkoxy group having 12 or less carbon atoms, a carboxy group and a sulfo group. $R^5$, $R^6$, $R^7$ and $R^8$ maybe the same or different and each represent a hydrogen atom or a hydrocarbon group having 12 or less carbon atoms, preferably a hydrogen atom from the standpoint of availability of materials for producing the dye. $Z^{1-}$ represents a counter anion, provided that when any one of $R^1$ to $R^8$ is substituted by a sulfo group, $Z^{1-}$ is not necessary. From the standpoint of storage stability of a coating solution for the photosensitive layer, $Z^{1-}$ is preferably a halogen ion, a perchlorate ion, a tetrafluoroborate ion, a hexafluorophosphate ion or a sulfonate ion, particularly a perchlorate ion, a hexafluorophosphate ion or an arylsulfonate ion.

Specific examples of the cyanine dye represented by formula (I) which can be preferably used in the invention are illustrated as [IR-1] to [IR-12] below, but the invention is limited thereto.

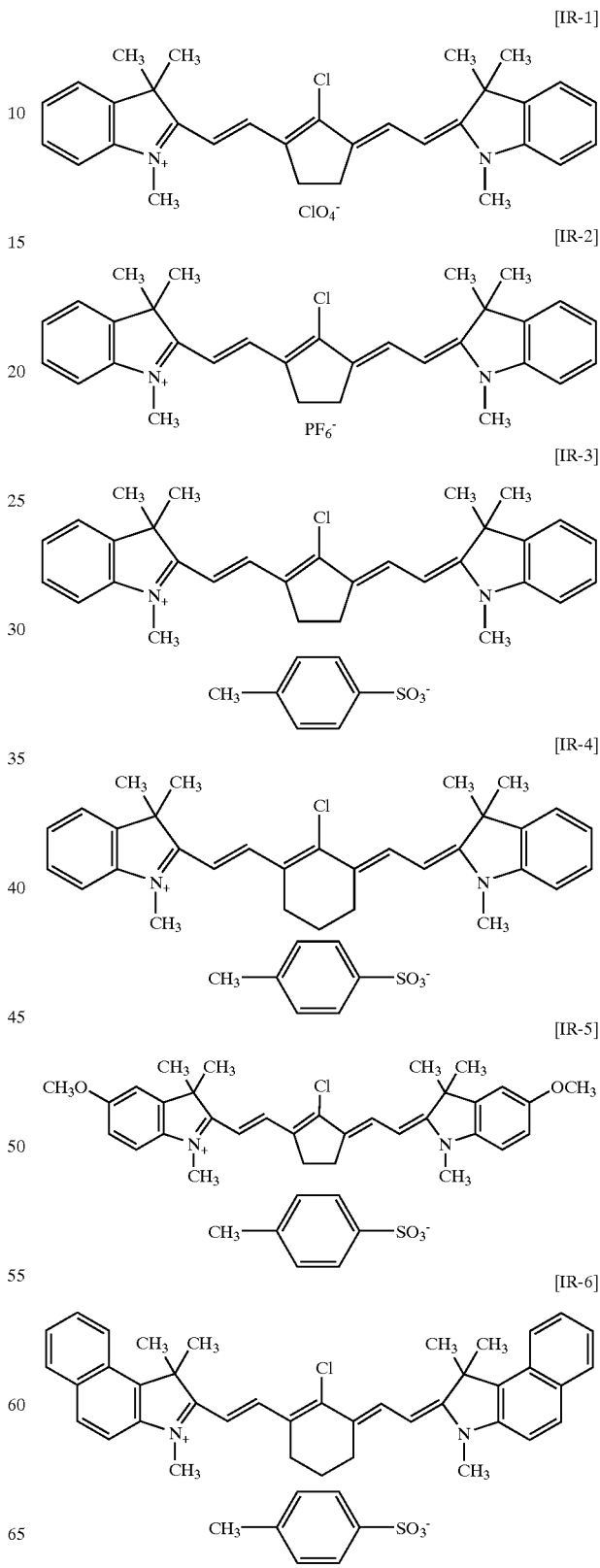

-continued

[IR-7]
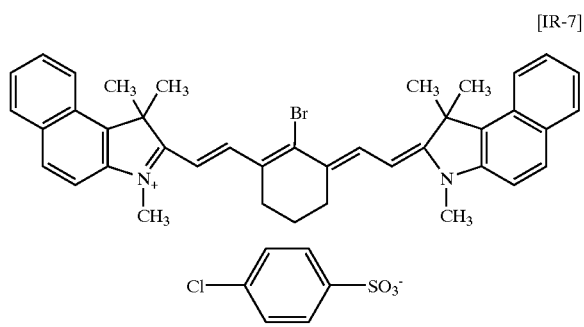

[IR-12]
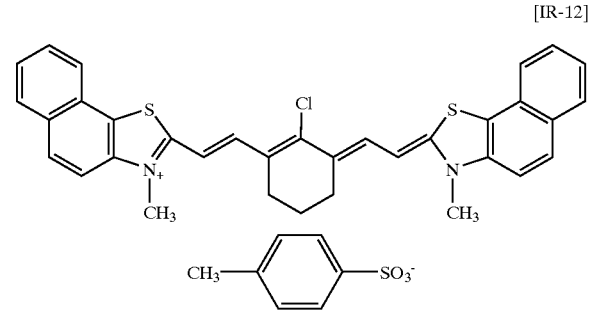

[IR-8]
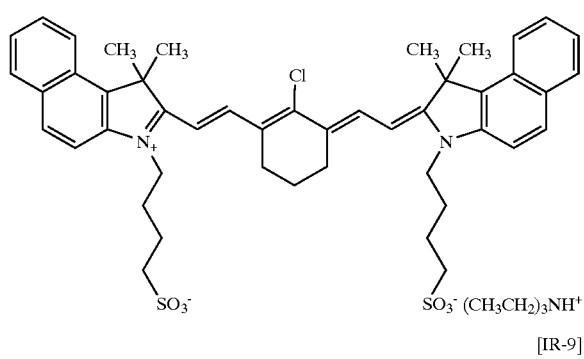

[IR-9]

[IR-10]
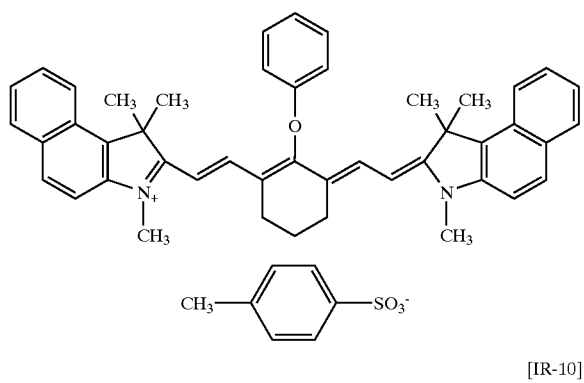

[IR-11]
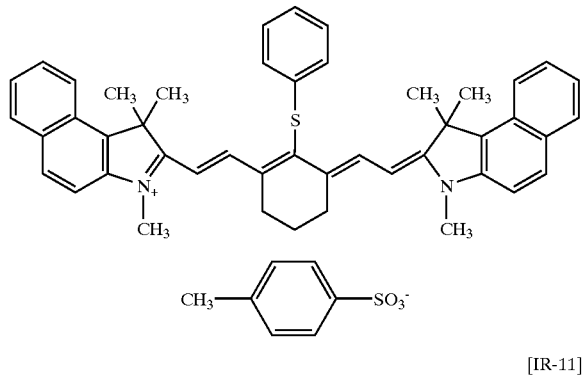

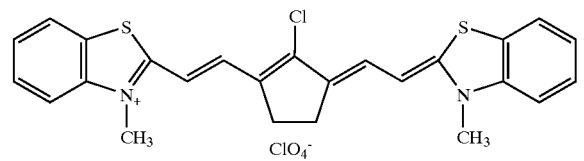

Examples of the pigment for use in the invention include commercially available pigments and known pigments as disclosed in Colour Index (C. I.), "Saishin Ganryo Binran (The Latest Handbook of Pigments)", Japan Association of Pigment Technology, 1977, "Saishin Ganryo Oyo Gijutsu (The Latest Technology of Application of Pigments)", CMC, 1986, and "Insatsu Inki Gijutsu (Printing Ink Technology)", CMC, 1984.

Examples of the kind of pigments used include black pigment, yellow pigment, orange pigment, brown pigment, red pigment, purplish pigment, blue pigment, green pigment, fluorescent pigment, metal powder pigment, and polymer-bonded dye. For details of the pigments, reference can be made to Japanese Patent Laid-Open No. 1998-39509, paragraphs [0052] to [0054]. These pigments can be applied also to the invention. Preferred among the pigments is carbon black.

The content of the dye or pigment in the photopolymerizable composition is preferably from 0.01 to 50% by weight, more preferably from 0.1 to 10% by weight, even more preferably from 0.5 to 10% by weight for the dye or from 1.0 to 10% by weight for the pigment, based on the total solid content of the composition.

When the aforementioned content is less than 0.01% by weight, the resulting photopolymerizable composition may have low sensitivity. On the contrary, when the aforementioned content exceeds 50% by weight, in the resulting lithographic printing plate, stain in the non-image area may occur.

<Other Components>

The photopolymerizable composition of the invention may further comprise other various compounds incorporated, if desired. For example, a dye having a large absorption in the visible range can be used as a colorant for image. Moreover, pigments, e.g., phthalocyanine-based pigments, azo-based pigments, carbon black and titanium oxide are preferably used.

The colorant is incorporated for the purpose of facilitating the distinction between image area and non-image area after the image formation, when the composition of the invention is used as a photosensitive layer of lithographic printing plate. The amount of the colorant incorporated is from 0.01 to 10% by weight based on the total solid content of the composition.

The composition of the invention preferably comprises a small amount of a heat polymerization inhibitor incorporated therein to inhibit unnecessary heat polymerization of the compound having a radical-polymerizable ethylenically unsaturated double bond during preparation or storage of a coating solution thereof. Preferred examples of the heat polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and aluminum salt of N-nitroso-N-phenylhydroxylamine. The amount of the heat polymerization inhibitor added is preferably from about 0.01 to 5% by weight based on the total solid content of the composition. If desired, the composition of the invention may comprise a higher aliphatic acid derivative such as behenic acid or behenic acid amide incorporated therein so that it is maldistributed on the surface of the photosensitive layer during drying after coating to prevent the inhibition of polymerization by oxygen. The amount of the higher aliphatic acid derivative added is preferably from about 0.1 to 10% by weight based on the total solid content of the composition.

The composition of the invention may further comprise a nonionic surface active agent as disclosed in Japanese Patent Laid-Open No. 1987-251740 and Japanese Patent Laid-Open No. 1992-208514 or an amphoteric surface active agent as disclosed in Japanese Patent Laid-Open No. 1984-121044 and Japanese Patent Laid-Open No. 1992-13149 incorporated therein to enlarge the stability of processing against development conditions.

Specific examples of the nonionic surface active agent include sorbitan tristearate, sorbitan monopalmitate, sorbitan triolate, monoglyceride stearate and polyoxyethylene nonyl phenyl ether.

Specific examples of the amphoteric surface active agent include alkyl di(aminoethyl)glycine, alkyl polyaminoethyl glycine hydrochloride, 2-alkyl-N-carboxyethyl-N-hydroxyethylimidazolinium betaine and N-tetradecyl-N,N-betaine (e.g., Amorgen K, produced by DAI-ICHI KOGYO SEIYAKU CO., LTD.).

The content of the aforementioned nonionic surface active agent and amphoteric surface active agent in a coating solution of the photosensitive layer is preferably from 0.05 to 15% by weight, more preferably from 0.1 to 5% by weight.

If necessary, the composition of the invention may further comprise a plasticizer incorporated therein for imparting flexibility of the coating or the like. Examples of the plasticizer employable include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

In the photopolymerizable composition of the invention, the radical initiator is decomposed by energy locally applied to the exposed area to generate a radical. By the acid or heat formed, the solid polymerizable compound, which is presumably present in the form of association or crystallite, is molten to become reactive. The radical acts to the resulting polymerizable functional group and the curing reaction proceeds. In the case where exposure to visible light or infrared rays is effected, the polymerizable compound readily melts due to heat to cause the progress of reaction because a dye or pigment capable of converting light to heat is present in the initiation system. Accordingly, the photopolymerizable composition of the invention is preferably used for exposure to visible light or infrared rays involving the generation of heat from the standpoint of sensitivity. In particular, the photopolymerizable composition of the invention is preferably used for recording by exposure to infrared laser beam involving local generation of high energy heat due to the use of an infrared absorbent.

In order to use the photopolymerizable composition of the invention as a photosensitive layer of lithographic printing plate precursor, a coating solution for the photosensitive layer obtained by dissolving or dispersing various components constituting the photopolymerizable composition in a solvent may be applied to an appropriate support to form the photosensitive layer.

Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethyl acetamide, N,N-dimethylformamide, tetramethylurea, N-methylpyrrolidone, dimethyl sulfoxide, sulfolane, γ-butyl lactone and water. However, the invention is not limited to these solvents. The solvents may be used singly or in admixture. The concentration of the aforementioned components (total solid content including additives) in the solvent is preferably from 1 to 50% by weight.

The amount (solid content) of the photosensitive layer which has been applied to and dried on the support may vary depending on the purpose but is normally preferably from 0.5 to 5.0 g/m$^2$ for a lithographic printing plate precursor. The less the coated amount of the photosensitive layer is, the higher is the apparent sensitivity, but the poorer are the film properties of the photosensitive layer, which acts to record images.

The application of a coating solution for the photosensitive layer can be accomplished by various methods, for example, bar coating method, rotary coating method, spray coating method, curtain coating method, dip coating method, air knife coating method, blade coating method and roll coating method.

<Support>

A support on which the coating composition for photosensitive layer is coated to prepare a lithographic printing plate precursor to which the composition of the invention can be applied is not specifically limited so far as the support is a sheet-like material having a dimensional stability and the desired strength and durability. Examples of the support include paper, paper laminated with plastic (e.g., polyethylene, polypropylene or polystyrene), a metal sheet (e.g., aluminum, zinc or copper), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film laminated or vacuum-deposited with the aforementioned metal. Preferred examples of the support include a polyester film and an aluminum sheet.

As the support for the lithographic printing plate precursor according to the invention there is preferably used an aluminum sheet, which has light weight and excellent surface treatment property, workability and corrosion resistance. Examples of the aluminum material which can be used for this purpose include JIS 1050 material, JIS 1100 material, JIS 1070 material, Al—Mg alloy, Al—Mn alloy, Al—Mn—Mg alloy, Al—Zr alloy, and Al—Mg—Si alloy.

The aluminum sheet is subjected to a surface treatment such as surface roughening, and then coated with the photosensitive layer to prepare a lithographic printing plate precursor. For the surface roughening, mechanical roughening, chemical roughening and electrochemical roughening may be employed singly or in combination. Further, anodization for preventing the aluminum surface from scratches or a treatment for enhancing the hydrophilicity of the aluminum surface is preferably effected.

The surface treatment of the support will be further described hereinafter.

The aluminum sheet may be optionally subjected to degreasing with a surface active agent, an organic solvent, an alkaline aqueous solution or the like for removing rolling oil from the surface thereof prior to roughening. If the alkaline aqueous solution is used, the degreasing may be followed by neutralization with an acidic solution or desmutting.

Subsequently, the support is subjected to surface roughening, i.e., so-called graining in a known manner for enhancing the adhesion between the support and the photosensitive layer and providing the non-image area with water retention. A specific example of the graining method is a mechanical graining method involving sand blasting. Another example of the graining method is a chemical graining method involving the roughening of surface with an etchant comprising an alkali, an acid or a mixture thereof. Alternatively, an electrochemical graining method, a method which comprises attaching a granular material to a support material with an adhesive or by a method having such an effect so that the surface thereof is roughened, or a roughening method which comprises pressing a continuous belt or roll having a fine roughness against a support material to transfer the roughness to the support material may be used.

The roughening methods may be used in combination. The order of effecting the roughening methods and the number of repetition of the roughening methods may be appropriately determined. The support which has been subjected to the surface roughening, i.e., the surface graining has smut produced on the surface thereof. In order to remove the smut, it is ordinarily preferred that the support thus processed is subjected to an appropriate treatment such as washing with water or alkaline etching.

The aluminum support for use in the invention, which has been subjected to the pretreatment, is then ordinarily subjected to anodization to form an oxidized film thereon for the purpose of enhancing abrasion resistance, chemical resistance and water retention thereof.

As an electrolyte for use in the anodization of aluminum sheet there may be used any material which can form a porous anodized film. In general, sulfuric acid, phosphoric acid, oxalic acid, chromic acid or a mixture thereof may be used. The concentration of electrolyte may be appropriately determined depending on the kind of the electrolyte. The anodization conditions vary with the electrolyte used and thus cannot be completely determined. In practice, however, the concentration of the electrolyte is from 1 to 80% by weight, the bath temperature is from 5 to 70° C., the current density is from 5 to 60 $A/dm^2$, the voltage is from 1 to 100 V, and the electrolysis time is from 10 seconds to 5 minutes. The amount of the anodized film is preferably not less than 1.0 $g/m^2$, more preferably from 2.0 to 6.0 $g/m^2$. When the amount of the anodized film is less than 1.0 $g/m^2$, the resulting lithographic printing plate exhibits an insufficient press life or is subject to scratching on the non-image area, resulting in so-called "scratch toning" wherein ink is attached to the scratches during printing.

The aluminum support which has been anodized may be then subjected to processing with an organic acid or salt thereof or provided with an undercoating layer for photosensitive layer before use.

An interlayer may be provided for enhancing the adhesion between the support and the photosensitive layer. In order to enhance the adhesion, the interlayer ordinarily comprises a diazo resin or a phosphoric acid compound which is adsorbed to aluminum. The thickness of interlayer is appropriately determined but should be so as to perform uniform bond-forming reaction with the photosensitive layer provided thereon. In general, the amount of the interlayer is preferably from about 1 to 100 $mg/m^2$, particularly from 5 to 40 $mg/m^2$ as calculated in terms of dried solid content. The proportion of diazo resin used in the interlayer is from 30% to 100%, preferably from 60% to 100%.

Referring to preferred properties of the support for lithographic printing plate, the central line average roughness is from 0.10 μm to 1.2 μm. When the central line average roughness of the support is less than 0.10 μm, the adhesion to photosensitive layer decreases and hence press life is remarkably degraded. On the contrary, when the central line average roughness of the support exceeds 1.2 μm, the stain resistant property during printing is deteriorated. The color density of support is suitably from 0.15 to 0.65 as calculated in terms of reflection density. When the density of support is lower than 0.15 (whiter than the above defined range), strong halation occurs during image wise exposure and the image formation tends to be injured. On the contrary, when the density of support is higher than 0.65 (blacker than the above defined range), difficulty is encountered in appreciating the image at plate inspection after development. Specifically, the resulting printing plate exhibits a very poor plate inspection property.

A lithographic printing plate precursor comprising the photopolymerizable composition of the invention as a photosensitive layer can be prepared as described above. The lithographic printing plate precursor can record using various light sources having wavelengths adapted for the polymerization initiators used. Also, recording using an ultraviolet lamp or thermal recording using a thermal head can be conducted.

Examples of the source of active rays for use in imagewise exposure include mercury lamp, metal halide lamp, xenon lamp, chemical lamp, and carbon-arc lamp. Examples of the radiation include electron rays, X-radiation, ion beam, and far infrared rays. Other examples of the radiation include g-ray, i-ray, deep-UV rays, and high density energy beam (laser beam). Examples of the laser include helium neon laser, argon laser, krypton laser, helium cadmium laser and KrF excimer laser.

In the invention, particularly, a system using an infrared absorbent is preferably subjected to imagewise exposure to solid laser or semiconductor laser emitting infrared rays having a wavelength of from 760 nm to 1,200 nm. The output of the laser used is preferably not lower than 100 mW. A multi-beam laser device is preferably used to reduce the exposure time. Further, the exposure time per pixel is preferably not greater than 20 microseconds. The energy of light with which the recording material is irradiated is preferably from 10 to 300 $mJ/cm^2$.

As a developer and its replenisher for use in a development step in the preparation of lithographic printing plate according to the invention, an aqueous alkali solution heretofore known is used.

Examples of the alkali used include an inorganic alkali salt, e.g., sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide or lithium hydroxide. Also, an organic alkali agent, e.g., monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisoropanolamine, ethylenimine, ethylenediamine or pyridine is used. The alkali agents may be used singly or in combination of two or more thereof.

Particularly preferred among the developers is an aqueous solution of silicate, e.g., sodium silicate or potassium silicate. The reason for this is that the developing property can be adjusted by controlling a ratio of silicon oxide $SiO_2$ and alkaline metal oxide $M_2O$ each constituting the silicate and a concentration thereof. For example, alkaline metal silicates as disclosed in Japanese Patent Laid-Open No. 1979-62004 and Japanese Patent Publication No. 1982-7427 can be effectively used.

It is known that in the case where an automatic developing machine is used to conduct development, the addition of an aqueous solution (replenisher) having a higher alkalinity than that of the developer makes it possible to process a large amount of PS plates without exchanging the developer in the development tank for a long period of time. The replenishment process can also preferably applied to the invention. The developer and replenisher may comprise various surface active agents or organic solvents for the purpose of accelerating or inhibiting the developing property and enhancing the dispersibility of development scum and the ink-receptivity of image area in a printing plate.

Preferred examples of the surface active agent employable herein include anionic surface active agent, cationic active agent, nonionic surface active agent, and amphoteric surface active agent. If desired, the developer and replenisher may further comprise a reducing agent, for example, hydroquinone, resorcinol, a sodium or potassium salt of inorganic acid, e.g., sulfurous acid or hydrogen sulfurous acid, an organic carboxylic acid, an antifoaming agent or a water softener.

The printing plate developed with the aforementioned developer and replenisher is then subjected to a post-treatment with water, a rinsing solution containing a surface active agent or a desensitizer containing gum arabic or a starch derivative. In the case where the image recording material according to the invention is used as a printing plate, the printing plate may be subjected to these treatments in combination.

In recent years, an automatic developing machine for printing plate has been widely used in the field of plate making and printing for the rationalization and standardization of the plate-making procedure. The automatic developing machine ordinarily comprises a developing portion, a post-treatment portion, a device for conveying a printing plate, various processing tanks, and a spray device. In operation, an exposed printing plate is sprayed with various processing solutions pumped up while being horizontally conveyed to undergo development. A method is also recently known which comprises conveying a printing plate guided by a submerged guide roll through processing tanks filled with processing solutions so that it is processed. In accordance with such an automatic developing method, processing can be effected while replenishing each processing solution with its replenisher according to the amount of processing, operation time, etc. Alternatively, a so-called throwaway process involving the processing with substantially unused processing solutions may be used.

The lithographic printing plate thus obtained may be coated with a desensitizing gum, if desired, before being supplied to the printing step.

As described above, a lithographic printing plate precursor comprising the photopolymerizable composition of the invention as a photosensitive layer is subjected to predetermined processing steps to form an image thereon, whereby a lithographic printing plate is obtained. The lithographic printing plate is then mounted on an offset printing machine for printing a large number of sheets.

The photopolymerizable composition of the invention can cure at a high sensitivity when exposed to UV rays, visible light, infrared laser beam or the like. Since the film thus cured undergoes no plastic flow, it can avoid adhesion, deformation and scratching when stored in piles. The film thus cured is uniform and stable and has excellent image-forming properties. Accordingly, the photopolymerizable composition of the invention can be used for various purposes, for example, flexo printing plate, color proof, dry lithographic film, photoresist or color filter, in addition to the photosensitive layer of lithographic printing plate precursor as described above in detail.

The invention will be further described in detail with reference to the following examples, but the invention should not be construed as being limited thereto.

EXAMPLE 1

<Preparation of Support>

An aluminum sheet (JIS 1050) having a thickness of 0.30 mm was washed with trichloroethylene so that it was degreased. The aluminum sheet was grained its surface with a nylon brush and an aqueous suspension of 400-mesh pumice stone, and then thoroughly washed with water. The aluminum sheet was dipped in a 25% aqueous solution of sodium hydroxide at 45° C. for 9 seconds so that it was etched, washed with water, dipped in a 2% $HNO_3$ for 20 seconds, and then washed with water. The amount of etching on the grained surface of the aluminum sheet was about 3 $g/m^2$. Subsequently, the aluminum sheet was subjected to direct current anodization at a current density of 15 $A/dm^2$ with a 7% $H_2SO_4$ as an electrolyte to form an anodized film, washed with water, and then dried.

<Undercoating>

Subsequently, the aluminum support was coated with the following undercoating solution by means of a wire bar, and dried at a temperature of 90° C. for 30 seconds using a hot air dryer. The dried coated amount of the undercoating was 10 $mg/m^2$.

(Undercoating Solution)

| | |
|---|---|
| Copolymer of ethyl methacrylate and sodium 2-acrylamide-2-methyl-1-propanesulfonate (75:25 in molar ratio) | 0.1 g |
| 2-Aminoethylphosphonic acid | 0.1 g |
| Methanol | 50 g |
| Ion-exchanged water | 50 g |

<Photosensitive Layer>

Subsequently, the following coating solution for photosensitive layer (P-1) was prepared, applied to the aluminum sheet undercoated above using a wire bar, and then dried at a temperature of 115° C. for 45 seconds using a hot air dryer to form a photosensitive layer thereon. Thus, a lithographic printing plate precursor (P-1) was obtained. The dried coated amount of the photosensitive layer was from 1.25±0.05 g $m^2$.

(Coating Solution for Photosensitive Layer (P-1))

| | |
|---|---|
| Bis(acryloyloxyethyl)hydroxymethyl isocyanurate (polymerizable compound having the cohesive energy density of 921 J/cm³, hereinafter referred to as Polymerizable Compound M-1) | 1.0 g |
| Infrared absorbent (shown below) | 0.08 g |
| Polymerization initiator (shown below) | 0.25 g |
| Copolymer of allyl methacrylate and methacrylic acid (80:20 in molar ratio; weight average molecular weight: 130,000) | 1.0 g |
| Copper phthalocyanine pigment colorant | 0.1 g |
| Surface active agent (Megafac F-475, produced by Dainippon Ink and Chemicals, Inc.) | 0.02 g |
| Methyl ethyl ketone | 10 g |
| Methanol | 5 g |
| 1-Methoxy-2-propanol | 12 g |

Polymerizable Compound M-1

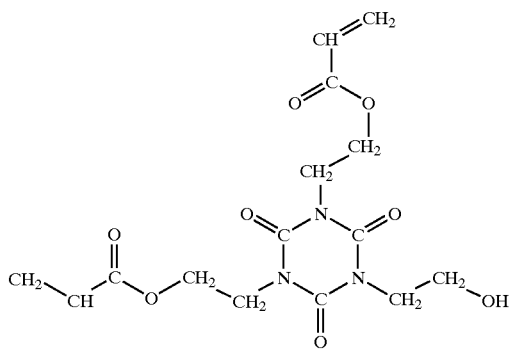

Infrared Absorbent

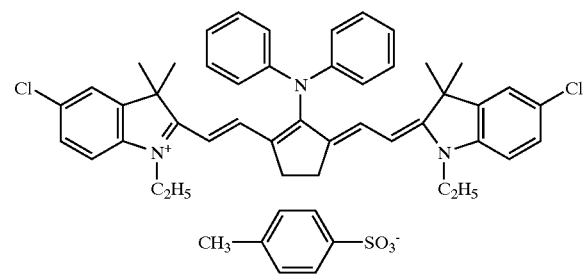

Polymerization Initiator

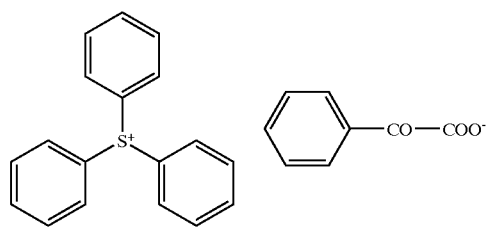

<Evaluation of Preservation Stability>

In order to evaluate the preservation stability, the lithographic printing plate precursor was allowed to stand in an incubator of 60° C. for 3 days. Then, with the lithographic printing plate precursor, an insolubilization ratio on the unexposed area and an image forming property were evaluated in the manner shown below. The results of evaluation are set forth in Table 3.

(Insolubilization Ratio)

The lithographic printing plate precursor was dipped in an equivolumetric mixture of dimethyl sulfoxide and methyl ethyl ketone for 5 minutes, and a weight of film dissolved (g/m²) was measured.

The insolubilization ratio (%) was determined from a weight of the original film (g/m²) previously measured and the weight of film dissolved (g/m²) as follows:

Insolubilization ratio (%)=(Weight of original film−Weight of film dissolved)×100/Weight of original film This method can evaluate polymerization in the dark at a higher sensitivity than evaluation of apparent developing properties differing with different kinds of developers. The value is preferably close to zero in the unexposed area.

(Image Forming Property)

The lithographic printing plate precursor was exposed to light with an energy of 200 mJ/cm² on the surface thereof using Trendsetter 3244VFS (produced by Creo Inc.) equipped with a water-cooled infrared semiconductor laser of 40 W.

Subsequently, the exposed lithographic printing plate precursor was subjected to development and gumming using an automatic developing machine (Stablon 900NP produced by Fuji Photo Film Co., Ltd.) loaded with the following composition (G) as a developer and a 1:1 aqueous solution of FP-2W (produced by Fuji Photo Film Co., Ltd.) as a gumming solution.

Developer (G)

| | |
|---|---|
| Potassium sulfite | 0.05% by weight |
| Potassium hydroxide | 0.1% by weight |
| Potassium carbonate | 0.2% by weight |
| Ethylene glycol mononaphtyl ether | 4.8% by weight |
| Tetrasodium salt of EDTA | 0.13% by weight |
| Silicone-based surface active agent | 0.02% by weight |
| Water | 94.7% by weight |

EXAMPLE 2

A coating solution for photosensitive layer (P-2) was prepared in the same manner as in Example 1 except that bis (acryloyloxyethyl) hydroxyethyl isocyanuate was replaced by bis{2-hydroxy-3-[(1-oxo-2-propenyl)oxy]propyl} 1,2-benzenedicarboxylate (cohesive energy density: 713 J/cm³ (hereinafter referred to as Polymerizable Compound M-2). A lithographic printing plate precursor was prepared using the coating solution for photosensitive layer (P-2) in the same manner as in Example 1. The dried coated amount of the photosensitive layer was from 1.25±0.05 g/m². The lithographic printing plate precursor (P-2) thus obtained was evaluated in the same manner as in Example 1. The results of evaluation are set forth in Table 3.

Polymerizable Compound M-2

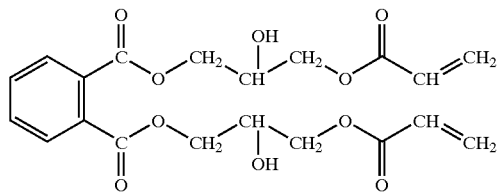

EXAMPLE 3

A coating solution for photosensitive layer (P-3) was prepared in the same manner as in Example 1 except that bis(acryloyloxyethyl)hydroxyethyl isocyanuate was replaced by N,N'-methacryloylhexamethylenediamine (cohesive energy density: 539 J/cm$^3$ (hereinafter referred to as Polymerizable Compound M-3). A lithographic printing plate precursor was then prepared using the coating solution for photosensitive layer (P-3) in the same manner as in Example 1. The dried coated amount of the photosensitive layer was from 1.25±0.05 g/m$^2$. The lithographic printing plate precursor (P-3) thus obtained was then evaluated in the same manner as in Example 1. The results of evaluation are set forth in Table 3.

Polymerizable Compound M-3

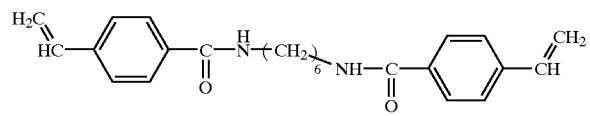

COMPARATIVE EXAMPLE 1

A coating solution for photosensitive layer (P-4) was prepared in the same manner as in Example 1 except that bis(acryloyloxyethyl)hydroxyethyl isocyanuate was replaced by pentaerythritol tetracrylate (cohesive energy density: 448 J/cm$^3$ (hereinafter referred to as Polymerizable Compound M-4). A lithographic printing plate precursor was prepared using the coating solution for photosensitive layer (P-4) in the same manner as in Example 1. The dried coated amount of the photosensitive layer was from 1.25±0.05 g/m$^2$. The lithographic printing plate precursor (P-4) thus obtained was evaluated in the same manner as in Example 1. The results of evaluation are set forth in Table 3.

Polymerizable Compound M-4

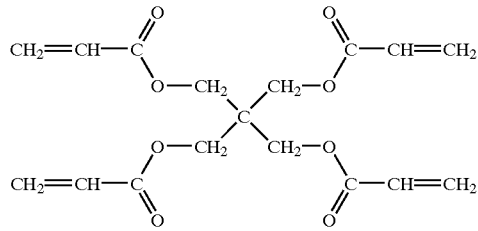

COMPARATIVE EXAMPLE 2

A coating solution for photosensitive layer (P-5) was prepared in the same manner as in Example 1 except that bis(acryloyloxyethyl)hydroxyethyl isocyanuate was replaced by 4,4'-bis(2-hydroxyethoxy)biphenyl diacrylate (cohesive energy density: 484 J/cm$^3$ (hereinafter referred to as Polymerizable Compound M-5). A lithographic printing plate precursor was prepared using the coating solution for photosensitive layer (P-5) in the same manner as in Example 1. The dried coated amount of the photosensitive layer was from 1.25±0.05 g/m$^2$. The lithographic printing plate precursor (P-5) thus obtained was evaluated in the same manner as in Example 1. The results of evaluation are set forth in Table 3.

Polymerizable Compound M-5

TABLE 3

| Example | Polymerizable Compound | Cohesive Energy Density (J/cm$^3$) | Insolubilization Ratio after Storage | Image Forming Property after Storage |
|---|---|---|---|---|
| Example 1 | M-1 | 921 | 5% or less | Good |
| Example 2 | M-2 | 713 | 5% or less | Good |
| Example 3 | M-3 | 539 | 10% | Good |
| Comparative Example 1 | M-4 | 448 | 35% | Poor Development |
| Comparative Example 2 | M-5 | 484 | 28% | Poor Development |

EXAMPLE 4

The following undercoating solution was applied to the aluminum support as prepared in Example 1 using a wire bar, and dried at a temperature of 90° C. for 30 seconds using a hot air dryer. The dried coated amount of the undercoating was 20 mg/m$^2$.

(Undercoating Solution)

| Methacrylyoloxyethylsulfonic acid | 0.2 g |
| Copolymer of methyl acrylate and sodium styrenesulfonate (75:25 in molar ratio) | 0.2 g |
| Calcium nitrate | 0.2 g |
| Methanol | 20 g |
| Ion-exchanged water | 80 g |

<Photosensitive Layer>

The following coating solution for photosensitive layer (P-6) was applied to the aforementioned undercoated support using a wire bar, and dried at a temperature of 120° C. for 45 seconds using a hot air dryer to form a recording layer thereon. Subsequently, the following coating solution for overcoat layer was applied thereon using a slide hopper, and dried at a temperature of 120° C. for 75 seconds using a hot air dryer to obtain a lithographic printing plate precursor (P-6). The coated amount of the photosensitive layer was 2.0 g/m². The coated amount of the overcoat layer was 2.3 g/m².

(Coating Solution for Photosensitive Layer P-6)

| Titanocene-based radical generator (CGI-784, produced by Ciba Specialty Chemicals Inc.) | 0.1 g |
| Polymerizable Compound (M-1) | 0.80 g |
| Light Absorber (VR-1) | 0.10 g |
| Polymer (PB-1) | 1.20 g |
| Copper phthalocyanine pigment | 0.04 g |
| Fluorine-based surface active agent (Megafac KF309, produced by Dainippon Ink and Chemicals, Inc.) | 0.03 g |
| Methyl ethyl ketone | 10 g |
| γ-Butyrolactone | 5 g |
| Methanol | 7 g |
| 1-Methoxy-2-propanol | 5 g |

The chemical structures of Light Absorber (VR-1) and Polymer (PB-1) used in the preparation of coating solution for photosensitive layer are shown below.

Polymer (PB-1) was synthesized by synthesizing a copolymer of methacrylic acid, N-isopropylacrylamide and ethyl methacrylate and then reacting the copolymer with 1,2-epoxy-3-methacryloyloxy methylcyclohexanone. The molar ratio of these components were 15:30:20:35. The weight average molecular weight of Polymer (PB-1) was 120,000.

Light Absorber (VR-1)

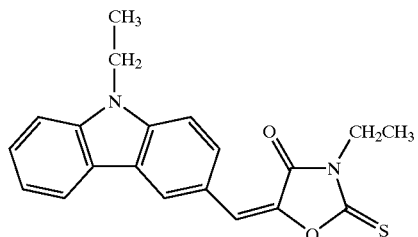

Polymer (PB-1)

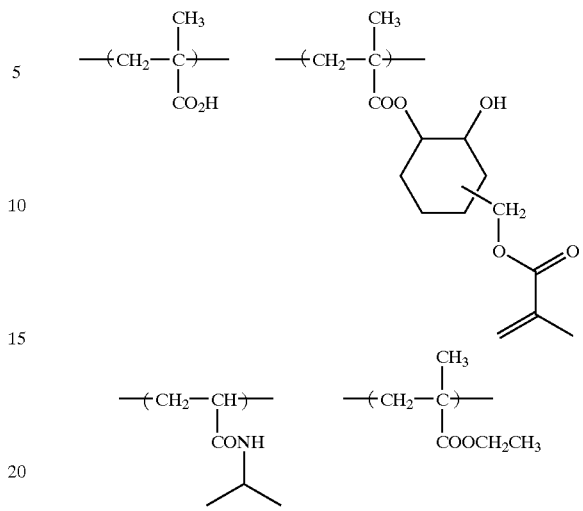

(Coating Solution for Overcoat Layer)

| Polyvinyl alcohol (Saponification degree: 98.5 mol %; polymerization degree: 500) | 3.0 g |
| Nonionic surface active agent (EMAREX NP-10, produced by Nihon Emulsion Co., Ltd.) | 0.05 g |
| Ion-exchanged water | 96.95 g |

The lithographic printing plate precursor thus obtained was evaluated its preservation stability in the same manner as in Example 1 except that the image forming property was evaluated in the following manner. The results of evaluation are set forth in Table 4.

(Evaluation of Image Forming Property)

The lithographic printing plate precursor was subjected to scanning exposure to a laser beam having a diameter of 12 μm from a 30 mW semiconductor laser emitting violet rays of 405 nm at an energy of 50 μJ/cm² on the surface thereof, and then processed in an automatic developing machine (LP-850P2, produced by Fuji Photo Film Co., Ltd.) loaded with a developer composition having the following formulation, which was kept at a temperature of 30° C., in the development tank, tap water in the second tank and a finishing gum solution obtained by diluting FP-2W (produced by Fuji Photo Film Co., Ltd.) with water twice in the third tank.

(Developer Composition)

| Sodium hydrogencarbonate | 26 g |
| Sodium ethylene glycol nononaphthyl ether monosulfate | 30 g |
| Ethylene glycol monododecyl ether | 20 g |
| Sodium sulfite | 3 g |
| Tetrasodium ethylenediaminetetraacetate | 1 g |
| Water | 920 g |

COMPARATIVE EXAMPLE 3

A coating solution for photosensitive layer (P-7) was prepared in the same manner as in Example 4 except that Polymerizable Compound M-1 was replaced by Polymerizable Compound M-4. The application of overcoat layer was conducted in the same manner as in Example 4 to obtain a lithographic printing plate precursor (P-7). The coated amount of the photosensitive layer was 2.0 g/m². The coated amount of the overcoat layer was 2.3 g/m². The lithographic printing plate precursor thus obtained was evaluated in the same manner as in Example 4. The results of evaluation are set forth in Table 4.

TABLE 4

| Example | Polymerizable Compound | Cohesive Energy Density (J/cm³) | Insolubilization Ratio after Storage | Image Forming Property after Storage |
|---|---|---|---|---|
| Example 4 | M-1 | 921 | 5% or less | Good |
| Comparative Example 3 | M-4 | 448 | 26% | Poor Development |

EXAMPLE 5

A coating solution for photosensitive layer (P-8) was prepared in the same manner as in Example 1 except that bis(acryloyloxyethyl)hydroxyethyl isocyanurate was replaced by Polymerizable Compound M-6 (cohesive energy density: 866 J/cm³) shown below and that the binder polymer was changed from the copolymer of allyl methacrylate and methacrylic acid to Binder Polymer (BP-1) shown below. Using the coating solution a lithographic printing plate precursor was prepared in the same manner as in Example 1. The dried coated amount of the photosensitive layer was from 1.25±0.05 g/m². The lithographic printing plate precursor thus obtained was evaluated in the same manner as in Example 1. The results of evaluation are set forth in Table 5.
Polymerizable Compound M-6 methacrylic acid and 0.538 g of V-59 (produced by Wako Pure Chemical Industries, Ltd.) in 70 g of N,N-dimethylacetamide over a period of 2.5 hours. After the completion of the dropwise addition, the solution was heated to 90° C. and then stirred for 2 hours. The reaction solution was cooled to room temperature and poured into 3.5 liters of water to precipitate a polymer compound. The polymer compound precipitated was collected by filtration, washed with water and dried to obtain 48.5 g of the polymer compound. A weight average molecular weight of the polymer compound was measured by gel permeation chromatography (GPC) using a polystyrene standard. The weight average molecular weight thereof was 124,000. An acid value of the polymer compound determined by titration was 1.30 meq/g (calculated value: 1.35 meq/g), and it was confirmed that the polymerization had been normally conducted.

In a 200-ml three neck flask were placed 26.0 g of the resulting polymer compound and 0.1 g of p-methoxyphenol, and they were dissolved in 60 g of N,N-dimethylacetamide. The resulting solution was cooled on an ice bath. After the temperature of the solution reached 5° C. or less, 30.4 g of 1,8-diazabicyclo[5.4.0]-7-undecene (DBU) was added dropwise thereto with a dropping funnel over a period of one hour. After the completion of the dropwise addition, the ice bath was removed, and the solution was further stirred for 8 hours. The reaction solution was poured into 2 liters of water containing 17 ml of concentrated hydrochloric acid to precipitate a polymer compound. The polymer compound precipitated was collected by filtration, washed with water and dried to obtain 18.2 g of Binder Polymer (BP-1).

The H NMR of the polymer compound obtained was measured. As a result, it was confirmed that all of the side chain groups resulting from Compound (A-1) were converted to methacryloyloxyethyl groups. A weight average molecular weight of the polymer compound measured by gel permeation chromatography (GPC) using a polystyrene

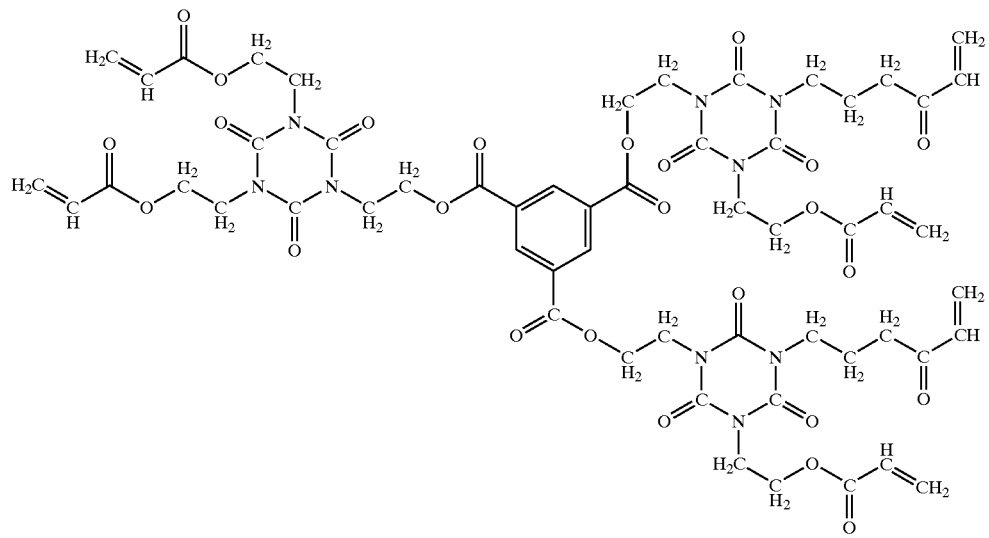

<Synthesis of Binder Polymer (BP-1)>

In a 1000-ml three neck flask was placed 70 g of N,N-dimethylacetamide and heated to 70° C. in a nitrogen gas stream. To the solution was dropwise added a solution of 33.5 g of Compound (A-1) shown below, 6.8 g of methacrylamide, 12.0 g of methyl methacrylate, 6.9 g of standard was 114,000. An acid value of the polymer compound determined by titration was 0.9 meq/g (calculated value: 0.8 meq/g).

Compound (A-1)

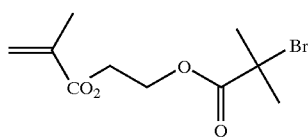

Binder Polymer (BP-1)

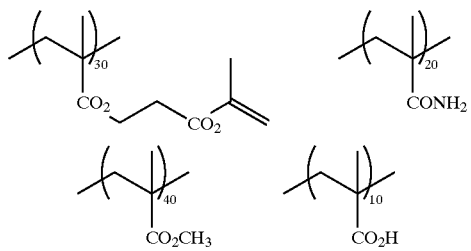

COMPARATIVE EXAMPLE 4

A coating solution for photosensitive layer (P-9) was prepared in the same manner as in Example 5 except that Polymerizable Compound M-6 was replaced by dipentaerythritol hexaacrylate (cohesive energy density: 453 J/cm$^3$ (hereinafter referred to as Polymerizable Compound M-7). Using the coating solution a lithographic printing plate precursor was prepared in the same manner as in Example 5. The dried coated amount of the photosensitive layer was from 1.25±0.05 g/m$^2$. The lithographic printing plate precursor thus obtained was evaluated in the same manner as in Example 5. The results of evaluation are set forth in Table 5.

Polymerizable Compound M-7

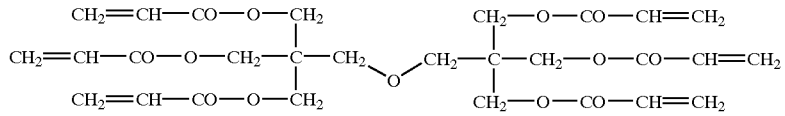

EXAMPLE 6

A coating solution for photosensitive layer (P-10) was prepared in the same manner as in Example 1 except that the binder polymer was changed from the copolymer of allyl methacrylate and methacrylic acid to Binder Polymer (BP-2) shown below. Using the coating solution a lithographic printing plate precursor was prepared in the same manner as in Example 1. The dried coated amount of the photosensitive layer was from 1.25±0.05 g/m$^2$. The lithographic printing plate precursor thus obtained was evaluated in the same manner as in Example 1. The results of evaluation are set forth in Table 5.

<Synthesis of Binder Polymer (BP-2)>

Binder Polymer (BP-2) was synthesized in the same manner as in Synthesis of Binder Polymer BP-1 except that 33.5 g of Compound (A-1) was replaced by 22.6 g of Compound (A-2) shown below. The H NMR of the polymer compound obtained was measured. As a result, it was confirmed that all of the side chain groups resulting from Compound (A-2) were converted to acryloyloxyethyl groups. A weight average molecular weight measured by gel permeation chromatography (GPC) using a polystyrene standard was 98,000. An acid value of the polymer compound determined by titration was 0.9 meq/g (calculated value: 0.8 meq/g).

Compound (A-2)

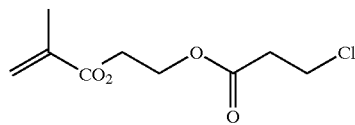

Binder Polymer (BP-2)

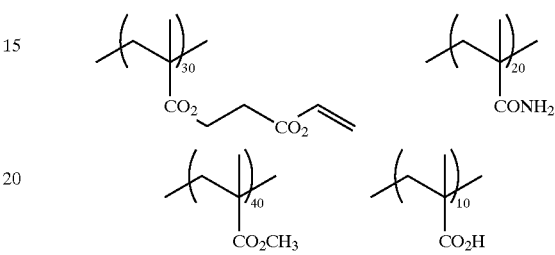

COMPARATIVE EXAMPLE 5

A coating solution for photosensitive layer (P-11) was prepared in the same manner as in Example 6 except that Polymerizable Compound M-1 was replaced by dipentaerythritol hexaacrylate (Polymerizable Compound M-7). Using the coating solution a lithographic printing plate precursor was prepared in the same manner as in Example 6. The dried coated amount of the photosensitive layer was from 1.25±0.05 g/m$^2$. The lithographic printing plate precursor thus obtained was evaluated in the same manner as in Example 6. The results of evaluation are set forth in Table 5.

TABLE 5

| Example | Polymer-izable Compound | Cohesive Energy Density (J/cm$^3$) | Binder Polymer | Insolubi-lization Ratio after Storage | Image Forming Property after Storage |
|---|---|---|---|---|---|
| Example 5 | M-6 | 866 | BP-1 | 5% or less | Good |
| Example 6 | M-1 | 921 | BP-2 | 5% or less | Good |
| Comparative Example 4 | M-7 | 453 | BP-1 | 45% | Poor Development |
| Comparative Example 5 | M-7 | 453 | BP-2 | 45% | Poor Development |

In order to evaluate printing durability and cleaner resistance of each printing plate obtained by imagewise exposure and development of the lithographic printing plate precursors in Examples 1 to 3, 5 and 6 and Comparative Examples 1, 2, 4 and 5, printing was conducted using a printing machine (Lithrone produced by Komori Corporation). The number of good printed matters obtained was determined to evaluate the printing durability. Also, in the printing procedure, the printing plate was cleaned with a plate cleaner (CL-1 produced by Fuji Photo Film Co., Ltd.) every 5,000 sheets printing and the number of good printed matters obtained was determined. The results obtained are set forth in Table 6.

TABLE 6

| Example | Polymerizable Compound | Cohesive Energy Density (J/cm³) | Number of Printed Matters | |
|---|---|---|---|---|
| | | | Not Cleaned with Cleaner | Cleaned with Cleaner |
| Example 1 | M-1 | 921 | 40,000 | 30,000 |
| Example 2 | M-2 | 713 | 40,000 | 30,000 |
| Example 3 | M-3 | 539 | 40,000 | 30,000 |
| Example 5 | M-6 | 866 | 60,000 | 50,000 |
| Example 6 | M-1 | 921 | 65,000 | 53,000 |
| Comparative Example 1 | M-4 | 448 | 20,000 | 10,000 |
| Comparative Example 2 | M-5 | 484 | 20,000 | 10,000 |
| Comparative Example 4 | M-7 | 453 | 25,000 | 12,500 |
| Comparative Example 5 | M-7 | 453 | 25,000 | 12,500 |

As is apparent from the results shown in Tables 3, 4 and 5, the lithographic printing plate precursors using the photopolymerizable composition of the invention in the photosensitive layer have the excellent preservation stability wherein the polymerization of polymerizable compound in the dark is restrained even after the storage at high temperature for a long period of time and provide images of high quality. From the results shown in Table 6, it is apparent that the lithographic printing plate precursors using the photopolymerizable composition of the invention in the photosensitive layer are also excellent in the printing durability and the resistance to chemicals at the printing.

As described above, the photopolymerizable composition of the invention cures at a high sensitivity when exposed to visible light or infrared laser beam and thus is suitable for use as a photosensitive layer for negative-working lithographic printing plate precursor capable of recording digital data directly from computer, etc. Further, the photopolymerizable composition of the invention has the excellent preservation stability wherein the polymerization of polymerizable compound in the dark is restrained even after the storage at high temperature for a long period of time and provides an image of high quality.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and score thereof.

What is claimed is:

1. A photopolymerizable composition which comprises (A) a polymerizable compound having at least one radical-polymerizable ethylenically unsaturated double bond per molecule and a cohesive energy density of not smaller than 500 J/cm³, (B) a radical polymerization initiator, (C) a binder polymer and cures when exposed to light and (D) a compound that generates heat when exposed to infrared rays in addition to the components (A),(B) and (C) and cures when exposed to infrared laser beam.

2. The photopolymerizable composition according to claim 1, wherein the radical polymerization initiator of (B) is an onium salt represented by the following formulae (III) to (V):

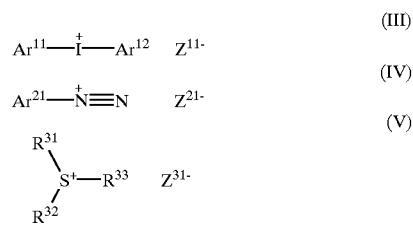

wherein $Ar^{11}$, $AR^{12}$ or $Ar^{21}$ each represent an aryl group having 20 or less carbon atoms which may have a substituent, $R^{31}$, $R^{32}$ and $R^{33}$ may be the same or different and each represent a hydrocarbon group having 20 or less carbon atoms which may have a substituent, and $Z^{11-}$, $Z^{21-}$ and $Z^{31-}$ each represent a counter ion selected from the group consisting of a halogen ion, a perchlorate ion, a tetrafluoroborate ion, a hexafluorophosphate ion and a sulfonate ion.

3. The photopolymerizable composition according to claim 1, wherein the compound that generates heat when exposed to infrared rays of (D) is a cyanine dye represented by the following formula (I):

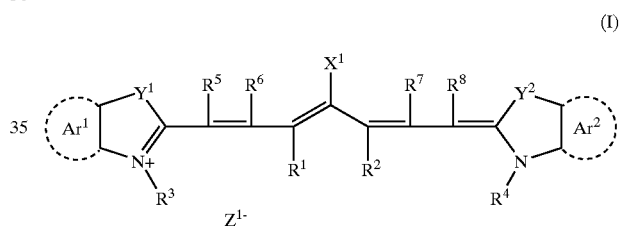

wherein $X^1$ represents a halogen atom, $X^2$-$L^1$ or $NL^2L^3$, $X^2$ represents an oxygen atom or sulfur atom, $L^1$ represents a $C_1$–$C_{12}$ hydrocarbon group, $L^2$ and $L^3$ each independently represent a $C_1$–$C_{12}$ hydrocarbon group, $R^1$ and $R^2$ each independently represent a $C_1$–$C_{12}$ hydrocarbon group, or $R^1$ and $R^2$ are connected to each other to form a 5-membered or 6-membered ring, $Ar^1$ and $Ar^2$ may be the same or different and each represent an aromatic hydrocarbon group which may have a substituent, $Y^1$ and $Y^2$ may be the same or different and each represent a sulfur atom or a dialkylmethylene group having 12 or less carbon atoms, $R^3$ and $R^4$ may be the same or different and each represent a hydrocarbon group having 20 or less carbon atoms which may have a substituent, $R^5$, $R^6$, $R^7$ and $R^8$ may be the same or different and each represent a hydrogen atom or a hydrocarbon group having 12 or less carbon atoms, and $Z^{1-}$ represents a counter anion, provided that when any one of $R^1$ to $R^8$ is substituted by a sulfo group, $Z^{1-}$ is not necessary.

4. The photopolymerizable composition according to claim 1, wherein the binder polymer is a (meth)acrylic resin having an ethylenically unsaturated double bond and a carboxy group in the side chain.

5. A lithographic printing plate precursor comprising a support and a photosensitive layer comprising a photopolymerizable composition which comprises (A) a polymerizable compound having at least one radical-polymerizable ethylenically unsaturated double bond per molecule and a cohesive energy density of not smaller than 500 J|cm$^3$, (B) a radical polymerization initiator, (C) a binder polymer and (D) a compound that generates heat when exposed to infrared rays and cures when exposed to infrared laser beam.

6. A lithographic printing plate precursor comprising a support and a photosensitive layer comprising a photopolymerizable composition which comprises (A) a polymerizable compound having at least one radical-polymerizable ethylenically unsaturated double bond per molecule and a cohesive energy density of not smaller than 500 J/cm$^3$, (B) a radical polymerization initiator and (C) a binder polymer and cures when exposed to light wherein the binder polymer is a (meth) acrylic resin having an ethylenically unsaturated double bond and a carboxy group in the side chain.

* * * * *